United States Patent [19]
Tanaka et al.

[11] Patent Number: 5,430,011
[45] Date of Patent: Jul. 4, 1995

[54] CRYSTAL COMPENSATED SUPERCONDUCTING THIN FILM FORMED OF OXIDE SUPERCONDUCTOR MATERIAL

[75] Inventors: So Tanaka; Michitomo Iiyama, both of Osaka, Japan

[73] Assignee: Sumitomi Electric Industries, Ltd., Osaka, Japan

[21] Appl. No.: 946,086

[22] Filed: Sep. 17, 1992

[30] Foreign Application Priority Data

Sep. 17, 1991 [JP] Japan .................................. 3-265161
Sep. 17, 1991 [JP] Japan .................................. 3-265162
Sep. 26, 1991 [JP] Japan .................................. 3-274717

[51] Int. Cl.$^6$ ..................... H01B 12/00; H01L 39/22; H01L 29/161; B05D 5/12
[52] U.S. Cl. .................................. 505/193; 257/15; 257/20; 257/35; 257/39; 505/234; 505/237; 505/238; 505/239; 505/701; 505/779; 427/62; 427/63
[58] Field of Search .............. 257/33, 35, 39, 20, 257/24; 505/1, 191, 193, 237, 238, 239

[56] References Cited

U.S. PATENT DOCUMENTS 4,894,691 1/1990 Matsui ..................... 257/20
5,087,605 2/1992 Hegde et al. ............ 257/661

FOREIGN PATENT DOCUMENTS 0280308 8/1988 European Pat. Off. .
0324044 7/1989 European Pat. Off. .
0342038 11/1989 European Pat. Off. .
0461592 12/1991 European Pat. Off. .
1101676 4/1989 Japan .

OTHER PUBLICATIONS

Rogers et al., "Fabrication of Heteroepitaxial YBa$_2$Cu$_3$O$_{7-x}$-PrBa$_2$Cu$_3$O$_{7-x}$ YBa$_3$O$_{7-x}$ Josephson Devices Grown by Laser Deposition", *Applied Physics Letters*, vol. 55, No. 19, pp. 2032–2034 (Nov. 1989).

Triscone et al., "YBa$_2$Cu$_3$O$_7$/PrBa$_2$Cu$_3$O$_7$ Superlattices: Properties of Ultrathin Superconducting Layers Separated by Insulating Layers," *Physical Review Letters*, vol. 64, No. 7, pp. 804–807 (Feb. 1990).

Obara et al., "Preparation of PrBa$_2$Cu$_3$O$_y$ and PrBa$_2$Cu$_3$O$_y$/YBa$_2$Cu$_3$O$_y$ Epitaxial Films using Molecular Beam Epitaxy," *Applied Physics Letters*, vol. 58, No. 3, 298–300 (Jan. 1991).

Bando et al., "Rheed Study of Crystal Growth of High Temperature Superconducting Oxides in Reactive Co-evaporation," *Physica C.*, vol. 180, pp. 3–10 (1991).

*Primary Examiner*—Mahshid D. Saadat
*Attorney, Agent, or Firm*—Foley & Lardner

[57] ABSTRACT

A superconducting thin film formed on a substrate, comprising at least one oxide superconductor layer formed on the principal surface of said substrate and at least one oxide layer formed of an oxide which compensates for crystalline incompleteness at the surface of said oxide superconductor layer, and which is arranged on or under the superconducting layer.

7 Claims, 2 Drawing Sheets

CRYSTAL COMPENSATED SUPERCONDUCTING THIN FILM FORMED OF OXIDE SUPERCONDUCTOR MATERIAL

BACKGROUND OF THE INVENTION

1. Field of the Invention

The present invention relates to a superconducting thin film, a superconducting device and a method for manufacturing thereof, and more specifically to a superconducting thin film formed of an oxide material, which has an oxide layer improving quality of the superconducting thin film, a superconducting device utilizing the superconducting thin film and a method for manufacturing thereof.

2. Description of Related Art

Fundamental devices which utilize superconductivity operate at a higher speed and/or lower power consumption so that they will have far better performance compared with those of semiconductor devices. The oxide superconductor materials which have been recently advanced in study make it possible to prepare superconducting devices which operate at relatively high temperature.

Superconducting devices have superconducting parts such as superconducting electrodes, superconducting channels, etc. These superconducting parts are usually formed of superconducting thin films. In order to prepare the superconducting parts, it is necessary to finely process superconducting thin films in order to obtain extremely fine structures. In this connection, it is desirable that the superconducting thin film has an ultra thin thickness.

An oxide superconductor has a layer-ed crystal structure and it is possible to stack in order each layer of the oxide superconductor crystal by an MBE (molecular beam epitaxy) process so as to form a crystalline oxide superconductor thin film. Therefore, it is also possible to form a crystalline oxide superconductor thin film in which crystalline lattices are disposed to constitute one unit-cell layer by an MBE process.

However, superconducting current does not flow in the crystalline oxide superconductor thin film of one unit-cell, therefore it is necessary to stack at least two unit-cells of crystalline lattices to form an oxide superconductor thin film in which superconducting current flows.

SUMMARY OF THE INVENTION

Accordingly, it is an object of the present invention to provide a crystalline oxide superconductor thin film in which crystalline lattices are disposed to constitute one unit-cell layer, which have overcome the above mentioned defects of the conventional ones.

Another object of the present invention is to provide a superconducting device which utilizes the crystalline oxide superconductor, which have overcome the above mentioned defects of the conventional ones.

Still another object of the present invention is to provide a method for manufacturing an oxide superconductor thin film which have overcome the above mentioned defects of the conventional ones.

The above and other objects of the present invention are achieved in accordance with the present invention by a superconducting thin film formed on a substrate, comprising at least one oxide superconductor layer formed on the principal surface of said substrate and at least one oxide layer formed of an oxide which improves at most surface of said oxide superconductor layer, and which is arranged on or under the superconducting layer.

The oxide superconductor layer of the superconducting thin film in accordance with the present invention may be composed of the oxide superconductor crystal layer in which one unit-cell of crystalline lattices are disposed.

In a preferred embodiment, the superconducting thin film in accordance with the present invention comprises multiple oxide superconductor layers formed of an oxide superconductor and multiple oxide layers formed of said oxide, which are stacked alternately. Of course, the oxide superconductor layers may be composed of the oxide superconductor crystal layers in which one unit-cell of crystalline lattices are disposed.

The oxide layer of the superconducting thin film in accordance with the present invention is preferably composed of $BaCuO_2$ or $Pr_1Ba_2Cu_3O_{7-\epsilon}$. In this connection, the oxide layer is composed of a complete crystalline $BaCuO_2$ layer or a complete crystalline $Pr_1Ba_2Cu_3O_{7-\epsilon}$ layer.

These oxide layers compensate for crystalline incompleteness of both on an upper surface and/or on a bottom surface of an oxide superconductor layer.

Therefore, lattice order on the upper or the bottom surfaces of the extremely thin oxide superconductor layer of the superconducting thin film in accordance with the present invention can be complete enough to conduct the superconducting current even if the oxide superconductor layer is composed of the oxide superconductor crystal layer in which only one unit-cell of crystalline lattices are disposed.

Therefore, it is possible to control carrier density of the superconducting thin film in accordance with the present invention by changing the number of the superconductor layers which are included among the whole film thickness.

For this purpose, the oxide layers are preferably composed of high crystallinity in which one to five unit-cells of crystalline lattices are stacked. The oxide layer which is composed of the incomplete crystal lattices does not have this effect.

According to another aspect of the present invention, there is provided a superconducting device comprising a substrate, an extremely thin superconducting channel formed on the principal surface of the substrate, a superconducting source electrode and a superconducting drain electrode of a relatively thick thickness formed of the oxide superconductor at the both side of the superconducting channel separated from each other but electrically connected through the superconducting channel, so that a superconducting current can flow through the superconducting channel between the superconducting source electrode and the superconducting drain electrode, and a gate electrode through a gate insulator on the superconducting channel for controlling the superconducting current flowing through the superconducting channel, in which superconducting channel is composed of a superconducting film which comprises multiple oxide superconductor layers formed of an oxide superconductor and multiple oxide layers formed of an oxide which improves at most surface of said oxide superconductor layers, in which the oxide superconductor layers and oxide layers are stacked alternately.

The current capability of the superconducting device in accordance with the present invention can be controlled by the number of the oxide superconductor layers contained in the superconducting channel.

According to still another aspect of the present invention, there is provided a Josephson junction device comprising a substrate and a first oxide superconductor layer formed on a principal surface of the substrate, a oxide layer formed on the first oxide superconductor layer and a second oxide superconductor layer formed on the oxide layer in which the oxide layer is composed of an oxide which improves at most surface of said oxide superconductor layers.

In a preferred embodiment, the oxide superconductor is formed of a high-$T_c$ (high critical temperature) oxide superconductor, particularly, formed of a high-$T_c$ copper-oxide type compound oxide superconductor for example a Y-Ba-Cu-O type compound oxide superconductor material, a Bi-Sr-Ca-Cu-O type compound oxide superconductor material, and a Tl-Ba-Ca-Cu-O type compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystallinity.

According to the methods of a second and a third aspects of the present invention, the oxide superconductor layer or layers and the oxide layer or layers are continuously formed by MBE. With this method, the oxide superconductor layer or layers and the oxide layer or layers of high crystallinity and sharp interfaces are obtained.

In order to form the oxide superconductor layer or layers and the oxide layer or layers continuously, all of the necessary molecular beam sources are prepared, at the beginning. The oxide superconductor layer or layers and the oxide layer or layers are continuously deposited by shuttering the required molecular beam sources.

In order to shutter each molecular beam sources accurately and in order to form the oxide superconductor layer or layers and the oxide layer or layers having precisely determined thickness, the thin film surface morphology are preferably monitored by RHEED (reflective high energy electron diffraction), while the oxide superconductor layer or layers and the oxide layer or layers are deposited.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Figure 1:
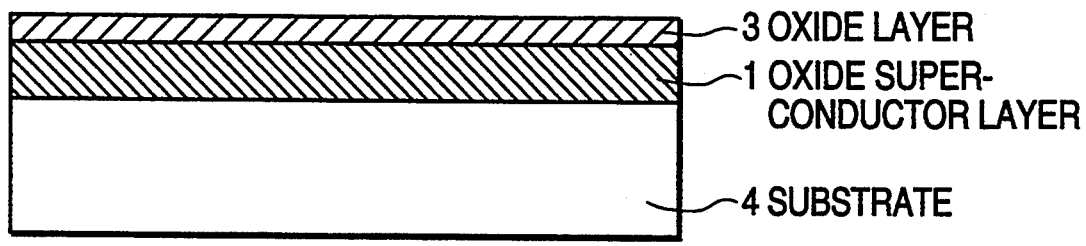
FIGS. 1 is a diagrammatic sectional view of a preferred embodiment of the the superconducting thin film in accordance with the present invention.

FIG. 1 shows a diagrammatic sectional view of one preferred embodiment of the superconducting thin film in accordance with the present invention. In FIG. 1, a superconducting thin film includes an oxide superconductor layer 1 formed of a $Y_1Ba_2Cu_3O_{7-\delta}$ oxide superconductor material on a MgO (100) substrate 4 and an oxide layer 3 stacked on the oxide superconductor layer 1.

The oxide superconductor layer 1 is composed of a c-axis orientated $Y_1Ba_2Cu_3O_{7-\delta}$ crystalline oxide superconductor layer in which crystalline lattices are disposed to constitute one unit-cell layer. The oxide superconductor layer 1 has a thickness of about 1.2 nanometers.

The oxide layer 3 is constituted of a crystalline $BaCuO_2$ layer, of which one unit-cell is the same as a half unit-cell of the $Y_1Ba_2Cu_3O_{7-\delta}$ oxide superconductor crystalline lattice, or a crystalline $Pr_1Ba_2Cu_3O_{7-\epsilon}$ layer which has a similar crystal structure to that of the $Y_1Ba_2Cu_3O_{7-\delta}$ oxide superconductor. The oxide layer 3 should be composed of a complete crystalline layer of the above oxides in which crystalline lattices are disposed at least one unit-cell thick.

In case of $BaCuO_2$, the oxide layer 3 has a thickness of about 0.5 nanometers, and in case of $Pr_1Ba_2Cu_3O_{7-\epsilon}$, the oxide layer 3 has a thickness of about 1.2 nanometers.

The oxide layer 3 compensates for a bared Cu-O plane at the outer most surface of the $Y_1Ba_2Cu_3O_{7-\delta}$ oxide superconductor layer 1 so that superconducting current flows through the oxide superconductor layer 1 in which $Y_1Ba_2Cu_3O_{7-\delta}$ crystalline lattices are disposed to constitute one unit-cell layer. Therefore, the above superconducting thin film in accordance with the present invention show superconductivity, though the oxide superconductor layer 1 is composed of the $Y_1Ba_2Cu_3O_{7-\delta}$ crystalline layer which has a thickness of only one unit-cell.

The above superconducting thin film in accordance with the present invention was prepared by the following process.

At first, a crystalline $Y_1Ba_2Cu_3O_{7-\delta}$ oxide superconductor layer 1 was deposited on a principal surface of a MgO (100) single crystalline substrate 4 by MBE. While the $Y_1Ba_2Cu_3O_{7-\delta}$ oxide superconductor layer 1 was growing, the surface morphology of the $Y_1Ba_2Cu_3O_{7-\delta}$ oxide superconductor layer 1 was monitored by RHEED so that the atomic layers which constituted the $Y_1Ba_2Cu_3O_{7-\delta}$ crystals were accurately stacked layer by layer so as to compose one unit-cell layer of the $Y_1Ba_2Cu_3O_{7-\delta}$ crystalline latices.

A condition of forming the c-axis orientated $Y_1Ba_2Cu_3O_{7-\delta}$ oxide superconductor layer 1 by MBE was as follows:

| | |
|---|---|
| Molecular beam source | Y: 1250° C. |
| | Ba: 600° C. |
| | Cu: 1040° C. |
| Pressure | $1 \times 10^{-5}$ Torr |
| Temperature of the substrate | 700° C. |
| Thickness | 1.2 nanometers |

Then, the Y molecular beam source was shuttered so that an oxide layer 3 composed of $BaCuO_2$ oxide thin film was continuously formed on the $Y_1Ba_2Cu_3O_{7-\delta}$ oxide superconductor layer 1. The $BaCuO_2$ oxide thin film was composed of a $BaCuO_2$ crystalline layer in which crystalline lattices were disposed to constitute one unit-cell layer.

A condition of forming the $BaCuO_2$ oxide thin film by MBE was as follows:

| Molecular beam source | Ba: 600° C. |
| --- | --- |
| | Cu: 1040° C. |
| Pressure | $1 \times 10^{-5}$ Torr |
| Temperature of the substrate | 700° C. |
| Thickness | 0.5 nanometers |

Then the superconducting thin film in accordance with the present invention was completed. The superconducting thin film prepared by the above process showed superconductivity, though the superconducting layer was composed of $Y_1Ba_2Cu_3O_{7-\delta}$ crystalline lattices which were disposed to constitute one unit-cell layer. Electrical resistance of the superconducting thin film disappeared at the temperature of 87 K so that the superconducting thin film showed superconductivity.

Another superconducting thin film of which the oxide layer was constituted of $Pr_1Ba_2Cu_3O_{7-\epsilon}$ oxide instead of $BaCuO_2$ was prepared by a similar process as mentioned above.

This superconducting thin film was manufactured by almost same method as the above mentioned method. Therefore, the difference will be described in the following.

When the superconducting thin film which utilized $Pr_1Ba_2Cu_3O_{7-\epsilon}$ for the oxide layer 3 was manufactured, in order to form the oxide layer 3, the Y molecular beam source was switched to the Pr molecular beam source so that an oxide layer 3 composed of $Pr_1Ba_2Cu_3O_{7-\epsilon}$ oxide thin film was continuously formed on the $Y_1Ba_2Cu_3O_{7-\delta}$ oxide superconductor layer 1 when the $Y_1Ba_2Cu_3O_{7-\delta}$ oxide superconductor layer 1 was completed. The $Pr_1Ba_2Cu_3O_{7-\epsilon}$ oxide thin film was composed of a $Pr_1Ba_2Cu_3O_{7-\epsilon}$ crystalline layer in which crystalline lattices were disposed to constitute one unit-cell layer.

A condition of forming the $Pr_1Ba_2Cu_3O_{7-\epsilon}$ oxide thin film by MBE is as follows:

| Molecular beam source | Pr: 1225° C. |
| --- | --- |
| | Ba: 600° C. |
| | Cu: 1040° C. |
| Pressure | $1 \times 10^{-5}$ Torr |
| Temperature of the substrate | 700° C. |
| Thickness | 1.2 nanometers |

Then, the superconducting thin film in accordance with the present invention which included one unit-cell $Y_1Ba_2Cu_3O_{7-\delta}$ oxide superconductor crystalline layer and one unit-cell $Pr_1Ba_2Cu_3O_{7-\epsilon}$ oxide crystalline layer was completed. The superconducting thin film prepared by the above process showed superconductivity, though the superconducting layer was composed of $Y_1Ba_2Cu_3O_{7-\delta}$ crystalline lattices which were disposed to constitute one unit-cell layer. Electrical resistance of the superconducting thin film disappeared at the temperature of 85 K so that the superconducting thin film showed superconductivity.

Embodiment 2

Figure 2:
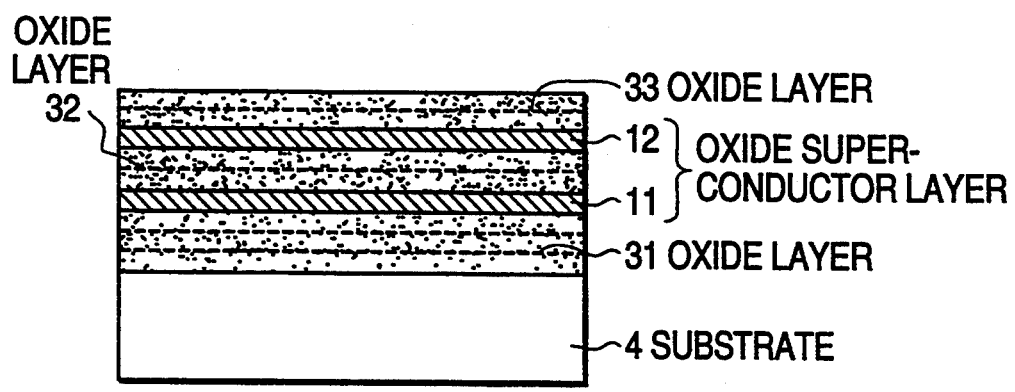
FIGS. 2 is a diagrammatic sectional view of another preferred embodiment of the superconducting thin film in accordance with the present invention.

FIG. 2 shows another preferred embodiment of the superconducting thin film in accordance with the present invention, in which the superconducting thin film has multiple oxide superconductor layers 11 and 12 and oxide layers 31, 32 and 33 on a substrate 4.

The oxide superconductor layers 11 and 12 are composed of c-axis orientated $Y_1Ba_2Cu_3O_{7-\delta}$ crystalline oxide superconductor layers in which crystalline lattices are disposed to constitute one unit-cell layers. Each of the oxide superconductor layer 11 and 12 has a thickness of about 1.2 nanometers.

The oxide layers 31, 32 and 33 are constituted of a crystalline $Pr_1Ba_2Cu_3O_{7-\epsilon}$ layers. Each of the oxide layer 31, 32 and 33 should be composed of a complete crystalline layer of the above oxides in which crystalline lattices are disposed at least one unit-cell thick.

In this embodiment, the oxide layer 31 is composed of the crystalline $Pr_1Ba_2Cu_3O_{7-\epsilon}$ oxide layer in which three unit-cells of the crystalline lattices are stacked. The oxide layers 32 and 33 are composed of the crystalline $Pr_1Ba_2Cu_3O_{7-\epsilon}$ oxide layers in which two unit-cells of crystalline lattices are stacked. The oxide layer 31 has a thickness of about 3.5 nanometers, each of the oxide layers 32 and 33 has a thickness of about 2.5 nanometers.

The current capability of the one unit-cell crystalline $Y_1Ba_2Cu_3O_{7-\delta}$ oxide superconductor layer is defined by the critical current density $J_c$ of $Y_1Ba_2Cu_3O_{7-\delta}$ oxide superconductor. Therefore, the current capability of the superconducting thin film is determined by number of the $Y_1Ba_2Cu_3O_{7-\delta}$ oxide superconductor unit-cell layers. Namely, it is possible to control substantial carrier density of the superconducting thin film accurately by changing the number of the $Y_1Ba_2Cu_3O_{7-\delta}$ oxide superconductor layers per unit thickness.

In this connection, the crystal unit-cell thickness of $Y_1Ba_2Cu_3O_{7-\delta}$ oxide superconductor are almost the same as that of $Pr_1Ba_2Cu_3O_{7-\epsilon}$ oxide. Therefore, it is possible to manufacture the superconducting thin film which has various current capability but the same thickness by changing the number of the $Pr_1Ba_2Cu_3O_{7-\epsilon}$ oxide unit-cell layers contained in the superconducting thin film.

The above superconducting thin film in accordance with the present invention was prepared by repeating the process of Embodiment 1. Namely, at first a $Pr_1Ba_2Cu_3O_{7-\epsilon}$ oxide layer 31 having a thickness of about 3.5 nanometers was deposited on a principal surface of a MgO (100) substrate 4 by an MBE method. In this connection, the atomic layers which constituted the $Pr_1Ba_2Cu_3O_{7-\epsilon}$ crystals were accurately stacked layer by layer or unit by unit so that the $Pr_1Ba_2Cu_3O_{7-\epsilon}$ oxide layer 31 was composed of a $Pr_1Ba_2Cu_3O_{7-\epsilon}$ crystal layer in which three unit-cells of the crystalline lattices were stacked. An MBE condition under which the $Pr_1Ba_2Cu_3O_{7-\epsilon}$ oxide layer 31 was formed was the same as the first embodiment.

Then, the Pr molecular beam source was switched to the Y molecular beam source so that a $Y_1Ba_2Cu_3O_{7-\delta}$ oxide superconductor layer 11 having a thickness of about 1.2 nanometers was continuously formed on the $Pr_1Ba_2Cu_3O_{7-\epsilon}$ oxide layer 31. The $Y_1Ba_2Cu_3O_{7-\delta}$ oxide superconductor layer 11 was composed of a $Y_1Ba_2Cu_3O_{7-\delta}$ crystalline layer in which crystalline lattices are disposed to constitute one unit-cell layer. An MBE condition under which the $Y_1Ba_2Cu_3O_{7-\delta}$ oxide superconductor layer 11 was formed was same as the first embodiment.

Thereafter, the Y molecular beam source was switched to the Pr molecular beam source again so that a $Pr_1Ba_2Cu_3O_{7-\epsilon}$ oxide layer 32 having a thickness of about 2.5 nanometers was continuously formed on the $Y_1Ba_2Cu_3O_{7-\delta}$ oxide superconductor layer 11. The $Pr_1Ba_2Cu_3O_{7-\epsilon}$ oxide layer 32 was composed of a $Pr_1Ba_2Cu_3O_{7-\epsilon}$ crystal layer in which two unit-cells of the crystalline lattices were stacked. An MBE condition under which the $Pr_1Ba_2Cu_3O_{7-\epsilon}$ oxide layer 32 was formed was same as the process under which the $Pr_1Ba_2Cu_3O_{7-\epsilon}$ oxide layer 31 was formed.

After then, the Pr molecular beam source was switched to the Y molecular beam source so that a $Y_1Ba_2Cu_3O_{7-\delta}$ oxide superconductor layer 12 having a thickness of about 1.2 nanometers was continuously formed on the $Pr_1Ba_2Cu_3O_{7-\epsilon}$ oxide layer 32. The $Y_1Ba_2Cu_3O_{7-\delta}$ oxide superconductor layer 12 was also composed of a $Y_1Ba_2Cu_3O_{7-\delta}$ crystalline layer in which crystalline lattices are disposed to constitute one unit-cell layer. An MBE condition under which the $Y_1Ba_2Cu_3O_{7-\delta}$ oxide superconductor layer 12 was foraged was same as the process under which the $Y_1Ba_2Cu_3O_{7-\delta}$ oxide superconductor layer 11 was formed.

Thereafter, the Y molecular beam source was switched to the Pr molecular beam source again so that a $Pr_1Ba_2Cu_3O_{7-\epsilon}$ oxide layer 33 having a thickness of about 2.5 nanometers was continuously formed on the $Y_1Ba_2Cu_3O_{7-\delta}$ oxide superconductor layer 12. The $Pr_1Ba_2Cu_3O_{7-\epsilon}$ oxide layer 33 was also composed of a $Pr_1Ba_2Cu_3O_{7-\epsilon}$ crystal layer in which two unit-cells of the crystalline lattices were stacked. An MBE condition under which the $Pr_1Ba_2Cu_3O_{7-\epsilon}$ oxide layer 33 was formed was same as the process under which the $Pr_1Ba_2Cu_3O_{7-\epsilon}$ oxide layer 31 was formed.

Then, the superconducting thin film in accordance with the present invention which included two one-unit-cell $Y_1Ba_2Cu_3O_{7-\delta}$ oxide superconductor crystalline layers and three $Pr_1Ba_2Cu_3O_{7-\epsilon}$ oxide crystalline layers was completed. The superconducting thin film prepared by the above process showed superconductivity, though each of the superconducting layers was composed of $Y_1Ba_2Cu_3O_{7-\delta}$ crystalline lattices which were disposed to constitute one unit-cell layer. Electrical resistance of each of the superconducting layers disappeared at the temperature of 85 K so that the superconducting thin film showed superconductivity.

Embodiment 3

Figure 3:
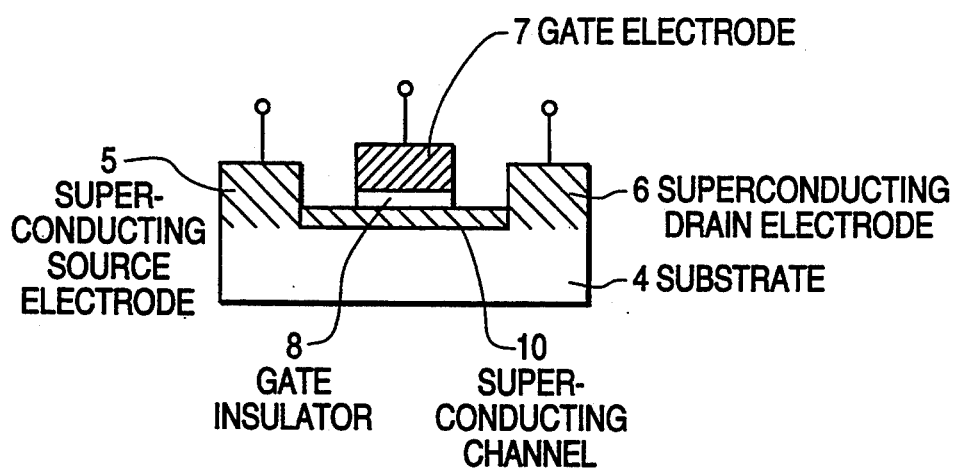
FIGS. 3 is a diagrammatic sectional view of a preferred embodiment of the super-FET in accordance with the present invention.

FIG. 3 shows a superconducting device (super-FET) in accordance with the present invention which has a superconducting channel 10 utilizing a superconducting thin film similar to the superconducting thin film of Embodiment 2 which has two one-unit-cell $Y_1Ba_2Cu_3O_{7-\delta}$ oxide superconductor crystalline layers and three one-unit-cell $Pr_1Ba_2Cu_3O_{7-\epsilon}$ oxide crystalline layers.

The super-FET has a substrate 4 on which the superconducting channel 10 is arranged. The substrate 4 can be formed of an insulating substrate, preferably an oxide single crystalline substrate such as MgO, $SrTiO_3$, $CdNdAlO_4$, etc. These substrate materials are very effective in forming or growing a crystalline film having a high degree of crystallinity.

A superconducting source electrode 5 and a superconducting drain electrode 6 which are composed of an oxide superconductor are arranged at the both sides of the superconducting channel 10 on the substrate 4. The superconducting source electrode 5 and the superconducting drain electrode 6 are electrically connected through the superconducting channel 10 so that superconducting current flows between the superconducting source electrode 5 and the superconducting drain electrode 6.

The superconducting source electrode 5 and the superconducting drain electrode 6 are preferably composed of the same oxide superconductor which is used for the superconducting channel 10. In this embodiment, they are composed of a-axis orientated $Y_1Ba_2Cu_3O_{7-\delta}$ oxide superconductor thin films.

A gate electrode 7 is stacked on a gate insulator 8 which is arranged on the superconducting channel 10. The superconducting current flowing through the superconducting channel 10 is controlled by a voltage which is applied to the gate electrode. The gate electrode 7 is composed of Au and the gate insulator 8 is composed of $SrTiO_3$.

In order to obtain a complete ON/OFF operation, both of the superconducting channel and the gate insulator of this type of super-FET should have an extremely thin thickness. For example, the superconducting channel formed of an oxide superconductor material should have a thickness of less than five nanometers, and the gate insulator should have a thickness more than ten nanometers which is sufficient to prevent a tunnel current.

The superconducting channel 10 of the above super-FET is composed of a superconducting thin film such as Embodiment 2. Therefore, it is possible to control the carrier density of the superconducting channel 10 by changing the number of the oxide superconductor layers and the oxide layers while thickness of the superconducting channel 10 is kept constant.

By this, the super-FET in accordance with the present invention can have various current capabilities.

Embodiment 4

Figure 4:
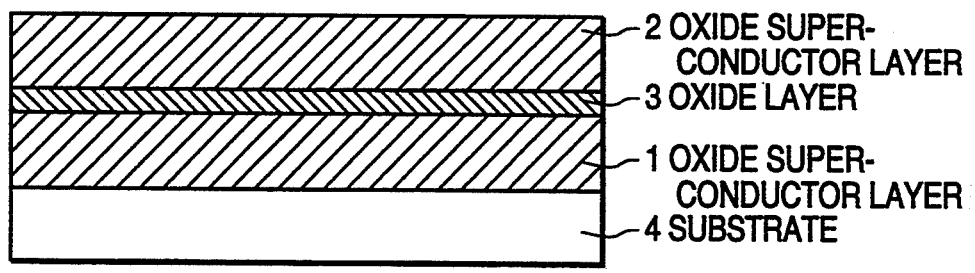
FIGS. 4 is a diagrammatic sectional view of a preferred embodiment of the Josephson device in accordance with the present invention.

FIG. 4 shows a tunnel type Josephson device in accordance with the present invention. The Josephson device has a substrate 4, a first oxide superconductor layer 1 formed on the substrate 4, an oxide layer 3 formed on the first oxide superconductor layer 1 and a second oxide superconductor layer formed on the oxide layer 3.

The first and second oxide superconductor layers 1 and 2 are formed of crystalline $Y_1Ba_2Cu_3O_{7-\delta}$ oxide superconductor having a thickness of 200 nanometers and the oxide layer 3 is formed of crystalline $Pr_1Ba_2Cu_3O_{7-\epsilon}$ oxide having a thickness of 5 nanometers.

The above Josephson device in accordance with the present invention was manufactured by the following process.

At first, a crystalline $Y_1Ba_2Cu_3O_{7-\delta}$ oxide superconductor layer 1 having a thickness of 200 nanometers was deposited on a principal surface of a MgO (100) single crystalline substrate 4 by an MBE. An MBE condition under which the $Y_1Ba_2Cu_3O_{7-\delta}$ oxide superconductor layer 1 was formed was the same as the first embodiment.

Then, the Y molecular beam source was switched to the Pr molecular beam source so that a $Pr_1Ba_2Cu_3O_{7-\epsilon}$ oxide layer 3 having a thickness of about 5 nanometers was continuously formed on the $Y_1Ba_2Cu_3O_{7-\delta}$ oxide superconductor layer 1. The $Pr_1Ba_2Cu_3O_{7-\epsilon}$ oxide layer 3 was composed of a $Pr_1Ba_2Cu_3O_{7-\epsilon}$ crystal layer in which four unit-cells of the crystalline lattices were stacked. An MBE condition under which the $Pr_1Ba_2Cu_3O_{7-\epsilon}$ oxide layer 3 was formed was same as the the first embodiment.

Thereafter, the Pr molecular beam source was switched to the Y molecular beam source so that a crystalline $Y_1Ba_2Cu_3O_{7-\delta}$ oxide superconductor layer 2 having a thickness of about 200 nanometers was continuously formed on the $Pr_1Ba_2Cu_3O_{7-\epsilon}$ oxide layer 3. An MBE condition under which the $Y_1Ba_2Cu_3O_{7-\delta}$ oxide superconductor layer 2 was formed was same as the process under which the $Y_1Ba_2Cu_3O_{7-\delta}$ oxide superconductor layer 1 was formed. Metal electrodes were formed on the oxide superconductor layer 1 and 2, if necessary.

With this, the Josephson device in accordance with the present invention was completed.

A current-voltage characteristics of the above mentioned Josephson device was measured at a temperature of 85 K. When a microwave of 15 GHz was irradiated, clear Shapiro steps were observed, therefore, it could be ascertained that the Josephson junction was realized in the device.

Figure 5:
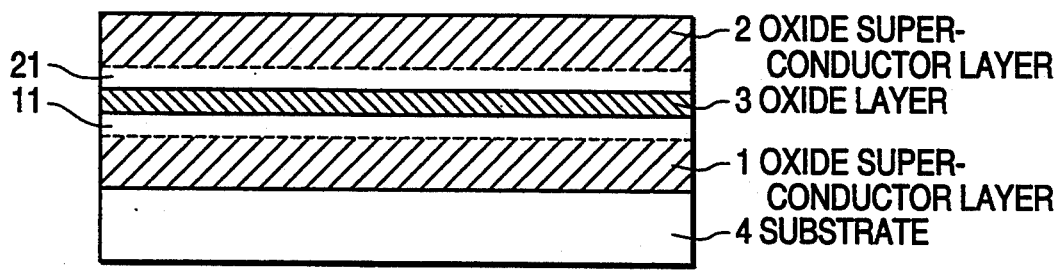
FIGS. 5 is a diagrammatic sectional view of a comparative example of the conventional Josephson device.

On the contrary, in a conventional Josephson device of which the oxide layer 3 was formed of MgO, as shown in FIG. 5, upper portion 11 of the $Y_1Ba_2Cu_3O_{7-\delta}$ oxide superconductor layer 1 and bottom portion 21 of the $Y_1Ba_2Cu_3O_{7-\delta}$ oxide superconductor layer 2 did not show superconductivity so that little Shapiro steps were observed.

The invention has thus been shown and described with reference to the specific embodiments. However, it should be noted that the present invention is in no way limited to the details of the illustrated structures but converts and modifications may be made within the scope of the appended claims.

We claim:

1. A superconducting channel of a superconducting field effect device formed on a substrate, comprising alternately stacked multiple oxide superconductor layers formed of an oxide superconductor and multiple oxide layers formed of an oxide, wherein the oxide layers compensate for the crystalline incompleteness of the oxide superconductor layers, wherein superconducting current flows from one end to the other of end of the channel substantially in parallel to the oxide layers, and wherein the carrier density of the superconducting channel is determined by the number of the oxide superconductor layers.

2. A superconducting thin film formed on a substrate, comprising an oxide layer formed on the principal surface of said substrate and at least one oxide superconductor layer formed on the oxide layer, wherein the oxide layer comprises an oxide which compensates for crystalline incompleteness at the surface of said superconductor layer, wherein the current path of the superconducting thin film is substantially parallel to the oxide layer, wherein the superconducting thin film is a superconducting channel of a superconducting field effect device and wherein the carrier density of the superconducting channel is determined by the number of the oxide superconductor layers.

3. A superconducting thin film formed on a substrate, comprising at least one oxide superconductor layer formed on the principal surface of said substrate and at least one oxide layer formed on the superconducting layer, wherein the oxide layer comprises an oxide which compensates for crystalline incompleteness at the surface of said superconductor layer, wherein the current path of the superconducting thin film is substantially parallel to the oxide layer, wherein the superconducting thin film is a superconducting channel of a superconducting field effect device and wherein the carrier density of the superconducting channel is determined by the number of the oxide superconductor layers.

4. A superconducting thin film formed on a substrate comprising alternately stacked multiple oxide superconductor layers formed of an oxide superconductor and multiple oxide layers formed of an oxide which compensates for the crystalline incompleteness of the oxide superconductor layers, and wherein the current path of the superconducting thin film is substantially parallel to the oxide layers, wherein the superconducting thin film is a superconducting channel of a superconducting field effect device and wherein the carrier density of the superconducting channel is determined by the number of the oxide superconductor layers.

5. A superconducting device comprising:
a substrate,
an extremely thin superconducting channel formed on the principal surface of the substrate,
a superconducting source electrode and a superconducting drain electrode of a relatively thick thickness formed of an oxide superconductor at the both sides of the superconducting channel separated from each other but electrically connected through the superconducting channel, so that superconducting current can flow through the superconducting channel between the superconducting source electrode and the superconducting drain electrode, and
a gate electrode connected to a gate insulator which is formed on the superconducting channel for controlling the superconducting current flowing through the superconducting channel by a signal voltage applied to the superconducting gate electrode,
in which the superconducting channel has a thickness such that a complete ON/OFF operation is realized when a signal voltage is applied to the superconducting gate electrode, and is composed of a superconducting film which comprises multiple oxide superconductor layers formed of an oxide superconductor and multiple oxide layers formed of an oxide which compensate for crystalline incompleteness at the surface of said oxide superconductor layers, in which the oxide superconductor layers and oxide layers are stacked alternately.

6. A device as claimed in claim 5, wherein the oxide superconductor layers are each composed of an oxide superconductor crystal layer having a thickness of one unit-cell of crystalline lattices.

7. A superconducting device as claimed in claim 5, wherein the superconducting channel comprises at least two oxide superconductor layers and at least two oxide layers, wherein the oxide superconductor layers alternate with the oxide layers, and wherein the carrier density of the superconducting channel is determined by the number of oxide superconductor layers.

* * * * *